United States Patent [19]

Shaw

[11] Patent Number: 5,036,285
[45] Date of Patent: Jul. 30, 1991

[54] RESONANT PROBE AND RADIO FREQUENCY COUPLER

[75] Inventor: Clifford O. Shaw, Colorado Springs, Colo.

[73] Assignee: The United States of America as represented by the Secretary of the Navy, Washington, D.C.

[21] Appl. No.: 375,435

[22] Filed: May 6, 1982

[51] Int. Cl.[5] ............................................. G01R 31/06
[52] U.S. Cl. ...................................... 324/546; 324/236
[58] Field of Search .......... 324/51, 59, 61 QS, 61 QL, 324/67, 236, 237, 546, 236

[56] References Cited

U.S. PATENT DOCUMENTS

| | | | |
|---|---|---|---|
| 2,326,344 | 8/1943 | Elmendorf et al. | 324/237 X |
| 2,448,794 | 9/1948 | Goldsmith, Jr. et al. | 324/237 X |
| 2,740,937 | 4/1956 | Cram et al. | 324/51 |
| 3,036,267 | 5/1962 | Semelman | 324/59 X |
| 3,094,959 | 9/1975 | Britton, Jr. | 324/57 |
| 3,133,245 | 5/1964 | Shievely | 324/58 |
| 3,212,000 | 10/1965 | Allerton et al. | 324/62 |
| 3,388,326 | 7/1968 | Brooks | 324/57 |
| 3,474,336 | 10/1969 | Alford | 324/58 |
| 3,525,937 | 8/1970 | Mozer | 324/72.5 |
| 3,769,575 | 10/1973 | Rist et al. | 324/236 X |
| 3,823,365 | 7/1974 | Anderson | 324/236 X |
| 4,220,915 | 9/1970 | Kawamoto | 324/58 A |

*Primary Examiner*—Theodore M. Blum
*Attorney, Agent, or Firm*—Melvin J. Sliwka; Sol Sheinbein

[57] ABSTRACT

A test arrangement for testing stripline mounted coils includes a resonant probe having a planar mounted coil imbedded in a dielectric housing. A signal generator connected to the probe and a readout device connected to the stripline complete the test arrangement.

11 Claims, 4 Drawing Sheets

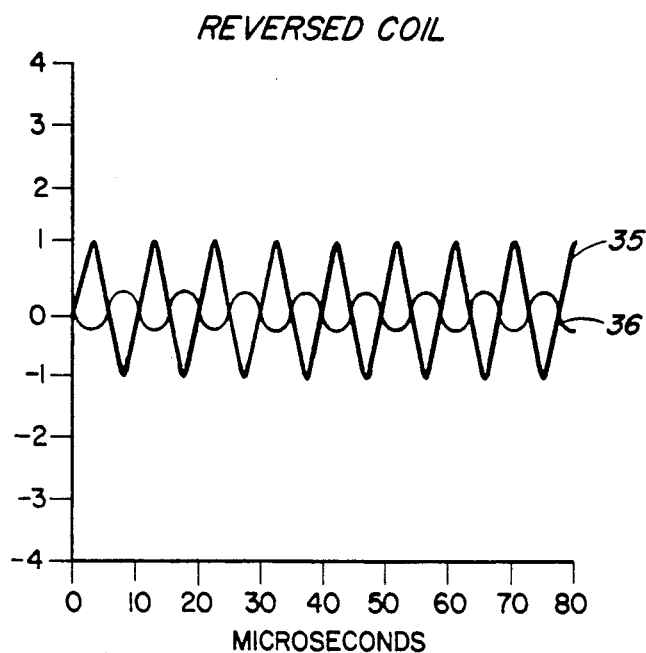
FIG. 4E
FIG. 5
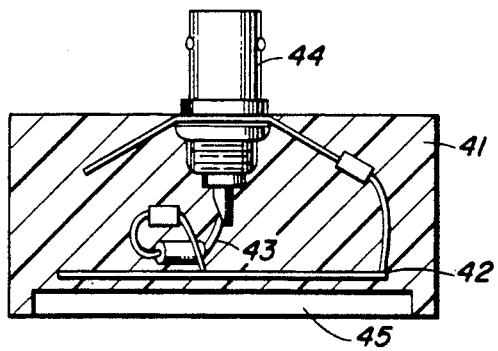
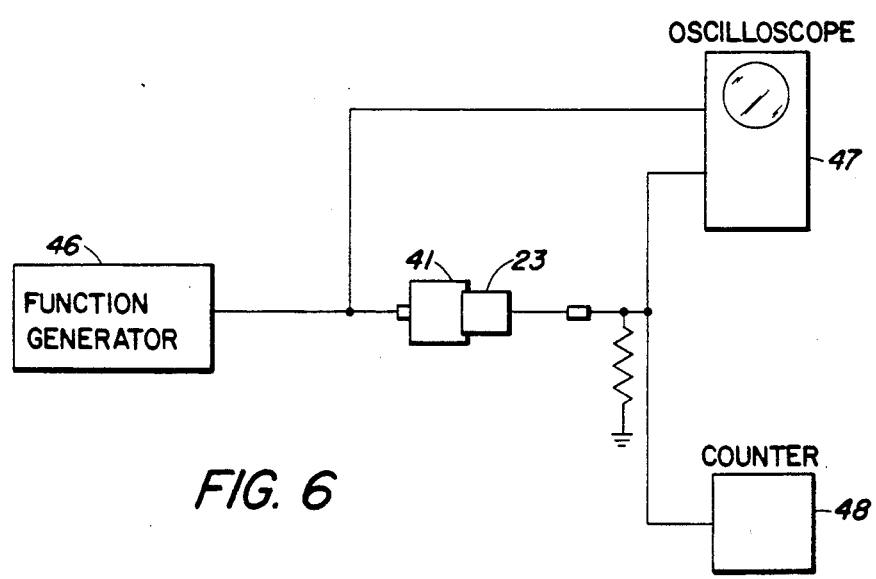
FIG. 6

RESONANT PROBE AND RADIO FREQUENCY COUPLER

BACKGROUND OF THE INVENTION

1. Field of the Invention

This invention pertains to the field of physics. More particularly, this invention pertains to the field of electromagnetic testing. In still greater particularity, the invention pertains to the testing of inductors mounted on a stripline feed system. By way of further particularity, but without specific limitation thereto, the invention will be described as it pertains to a test set for assuring the operability of energization coils for land mines used in an aerially deployed mining system, GATOR/CBU-78/B and CBU-89/B 2. Description of the Prior Art A variety of laboratory methods are utilized in checking inductance and capacitance systems. Where a plurality of low inductance inductors are mounted on a strip feedline, the testing has been difficult. That is, DC resistance tests or inductance tests require systems able to indicate with accuracy the very low value of resistance and inductance presented in a rigid stripline harness. In the assembly of such systems it is not uncommon for coils to be reversed or shorted such that they fail to function in the manner for which they were designed. As a result, many times where the components were subjected to only a visual inspection which failed to reveal internal defects, the armament system failed to function as designed. Therefore, there has been a need to have a test set which could electrically test these stripline mounted inductances prior to their assembly into a weapon system.

SUMMARY OF THE INVENTION

The invention is directed to a inductance test set where a RF generator is coupled to the inductance under test and its response is displayed on a read-out device. By reducing the test set to its simplist components, an assembly tester capable of being used in the field with existing read-out and RF generating equipment has been produced to satisfactory solve the problems of locating defective inductors and inductors which have been installed backwards, an ever present problem prior to this invention.

It is accordingly an object of this invention to provide an improved electrical test set.

A further object of this invention is to provide a test set to indicate the acceptable functioning of inductances mounted on a stripline feeding system.

Yet another object of this invention is to provide a test set to adequately test the self destruct circuitry on a CBU-78/B or CBU-98/B, GATOR, system.

Other objects, advantages, and novel features of the invention will become apparent from the following detailed description of the invention when considered in conjunction with the accompanying figures wherein:

BRIEF DESCRIPTION OF THE DRAWINGS

FIGS. 4A-4E are waveform diagrams showing the oscilloscope readout for various inductor conditions;

FIG. 5 is a side elevation view, partially in section, showing a calibrator probe used in calibrating the resonant probe of FIG. 3; and FIG. 6 is a block diagram illustrating the calibration arrangement used in calibrating the test set according to the invention.

DESCRIPTION OF THE PREFERRED EMBODIMENT

Figure 1:
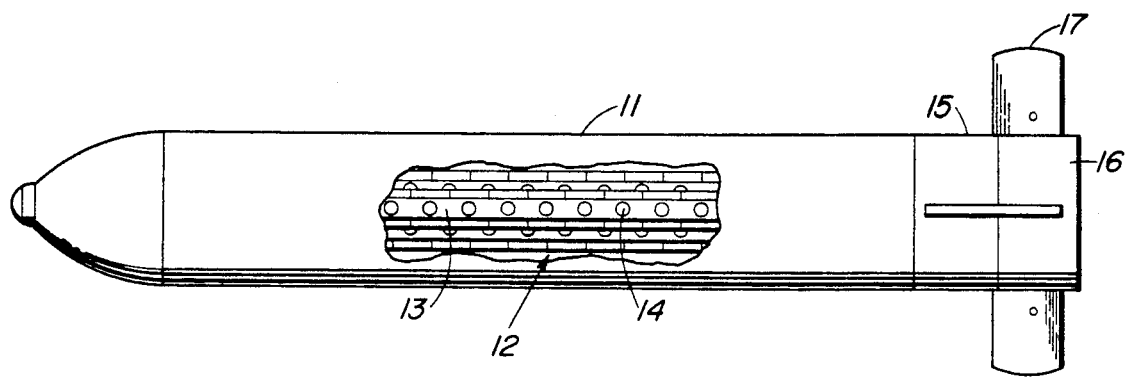
FIG. 1 is a perspective view of the GATOR armament system having a partial cutaway showing the stored land mines and stripline electronic armament units.

Referring to FIG. 1, the GATOR system according to the invention comprises a cylindrical housing 11 housing a plurality of individual small land mines shown a 12 therein. The preselected self-destruct time for each mine is programmed prior to deployment by a plurality of striplines, one shown at 13, which mount a plurality of inductors 14 thereon. A tail section 15 houses the electronics, which form no part of the present invention, and provides a mounting for tail section 16 having retractable fins 17 mounted thereon.

When deployed, aircraft releases cylindrical housing 11 which falls in a controlled descent which is stabilized by fins 17 until a proximity fuze in the nose section of housing 11 causes the individual mines to be armed and the housing 11 to separate such that the pay load of individual land mines 12 are deployed where they may interdict hostile forces.

If the stripline 13 or inductors 14 are improperly assembled, individual ones of land mines 12 may be deployed unarmed such that they fail to function. A shorted inductor can sometimes effect more than a single mine and open inductors or inductors installed backwardly such that their magnetic field is a reversed direction will fail to satisfactorily set the self-destruct circuit on each land mine and will cause a hazardous dud. Accordingly a simple method of testing the individual inductors after they have been assembled will now be described.

Figure 2:
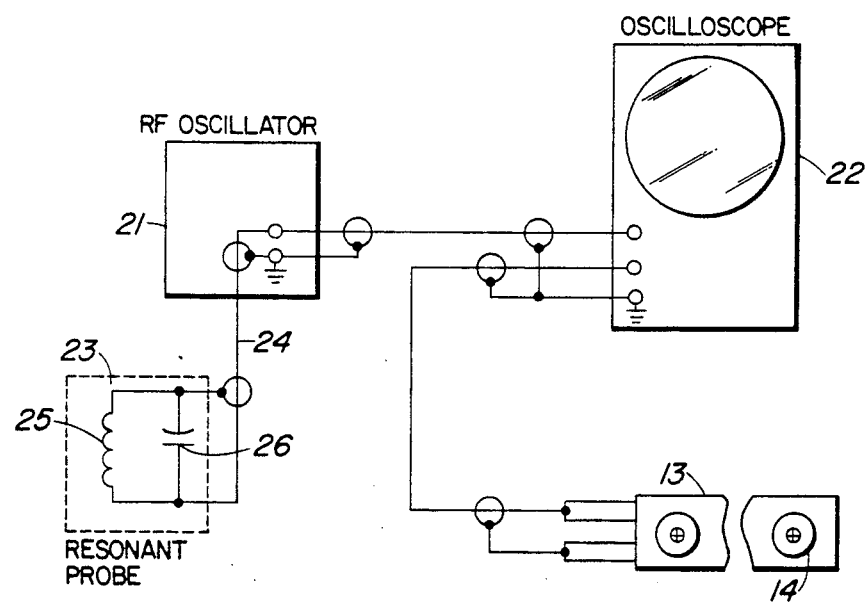
FIG. 2 is wiring diagram of the system of the invention as used in performing the tests.

Referring to FIG. 2 an operative arrangement of the test set is illustrated. The conventional RF oscillator 21 produces a 100 KHz output which is connected to a readout device 22 by means of conventional electronic interconnection wiring. Readout device 22 may be any suitable device for recording and displaying a radio frequency output but, in practice, a conventional oscilloscope has proven satisfactory in this embodiment and is illustrated. In actual practice an oscilloscope manufactured by the Tektronix Corp. under the designator model SC 502 has proven satisfactory. The stripline harness under test which comprises an electrical stripline 13 and a plurality of inductors 14 mounted thereon is also connected to readout device 22. The output of RF oscillator 21 is also fed to resonant probe 23 by means of a coaxial cable 24, as indicated.

As FIG. 2 illustrates, the internal components of resonant probe 23 are a simple inductor 25 and a fixed capacitor 26. The inductive and capacitive values of inductor 25 and capacitor 26 are chosen to resonant at the approximate 100 KHz desired operating frequency. As illustrated, the center conductor of the conducting coax of cable 24 is connected to the junction of capacitor 26 and inductor 25 while the shield is connected to the opposite junction of these components.

Figure 3:
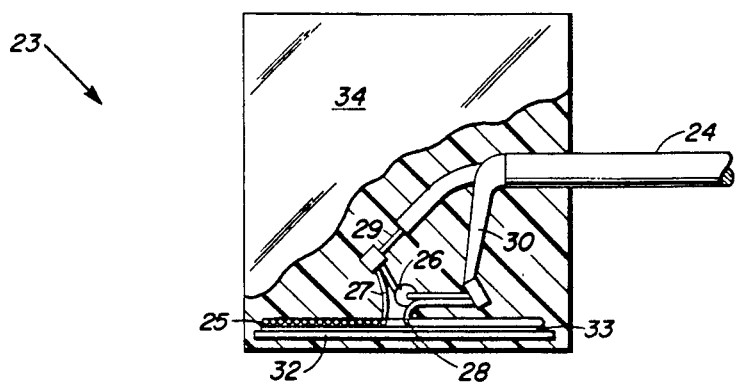
FIG. 3 is a side elevation view of the resonant probe illustrated in FIG. 2.

Referring to FIG. 3, the details of resonant probe 23 are more clearly illustrated. Coil 25 is shown to be a planer wound inductor having a central lead 27 which is merely a portion of the wiring forming inductor 25 and similarly, the outer coil thereof terminates in a lead 28. As shown, capacitor 26 is connected to center conductor 27 and outer conductor 28 at the junction between the central conductor 29 and the shield 30 of coaxial cable 24.

In order to insure that coil 25 lies in a plane it is stiffened prior to assembly by bonding to a insulating disc 32 by means of an adhesive 33. Adhesive 33 is shown enlarged for clarity of illustration and may be any commercial type adhesive which is compatible with the insulator 32 and the potting material from which the probe 23 is encased.

Insulator 32 may be of any sheet material having the requisite dielectric characteristics and compatible with the potting agent from which probe 23 is encased. In practice, the sheet is made from a plastic 1/32 inch thick complying with MIL-P-18177, type GEE. The sheet mounting of coil 25 permits the coil to lie precisely in a plane at the lower edge of body 34 and assume a position parallel and closely spaced therefrom. In practice, the dimension between the lower surface of insulator 32 and the bottom of body 34 is maintained at 0.002 inches. When the coaxial cable has been connected to coil 25 and capacitor 26, it is placed in a form and an insulating compound of commercially available type is poured about the coil and the coaxial cable and permitted to cure, in accordance with the manufacturers recommendation, to form housing body 34 to complete resonant probe 23.

In order to facilitate reaching each of the individual inductor 14 along stripline 13, coaxial cable 24 is made to a convenient length. In practice, a length of 48 inches has proven adequate. The end of coaxial cable 24 removed from resonant probe 23 is terminated with a conventional electrical conductor such that it may be attached to signal generator 21, FIG. 2.

OPERATION OF THE INVENTION

The operation of the device of the invention is essentially the combined electrical function of the various components. The circuitry is connected as shown at FIG. 2 and calibrated such that the probe and the signal generator are in resonance. Probe 23 is then advanced from one inductor 14 to another inductor 14 and the presentation observed on readout device 22.

Figure 4A:
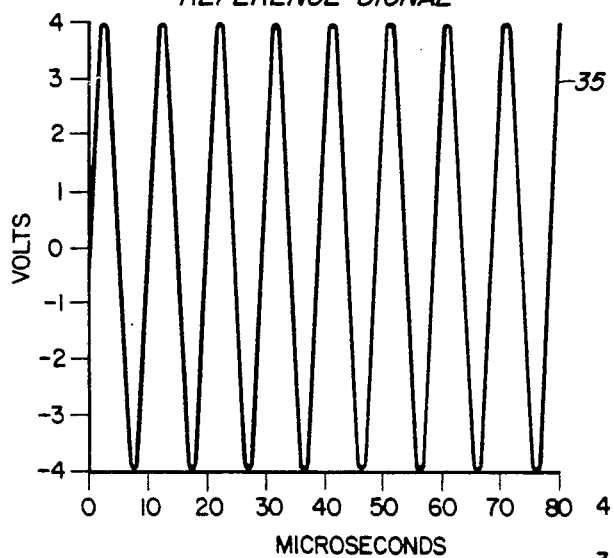

Referring to FIG. 4A, the oscilloscope presentation is shown when probe 23 is connected to RF oscillator 21 and adjusted such that a one volt signal occupies one division on the scale. Waveform 35 is illustrative of such a calibrated position.

Figure 4B:
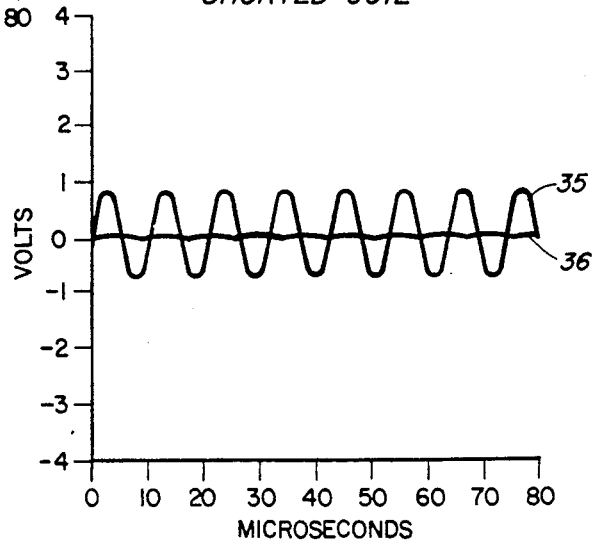

Referring to FIG. 4B, the effect of placing probe 23 over a shorted inductor 14 is illustrated. As shown, waveform 35 has been reduced in amplitude and the output from the stripline remains a nearly zero volt trace near the origin as illustrated at 36.

Figure 4C:
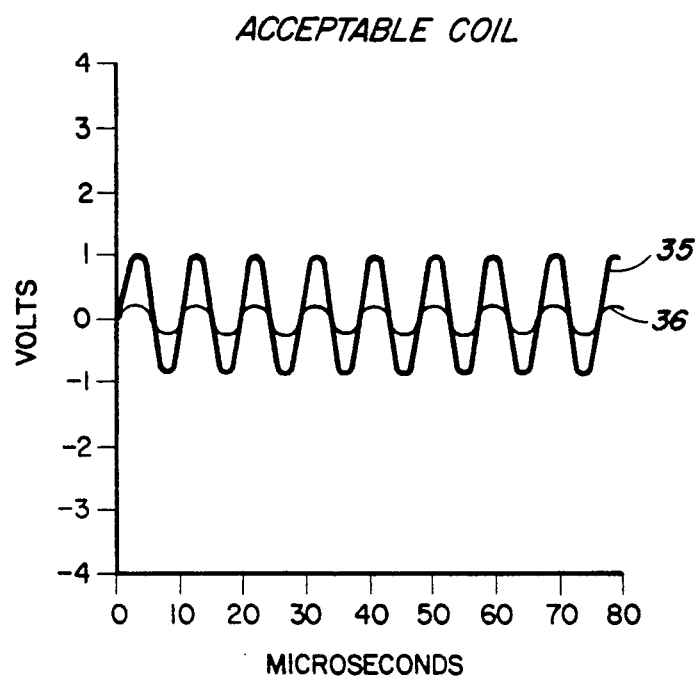

Referring to FIG. 4C, the effect of placing resonant probe 23 over an acceptable stripline harness inductor is illustrated. As shown, the reference trace 35 has been reduced in amplitude, although not so much as shown at FIG. 4B, while the harness output 35 shows an in phase sinusoidal signal of a lesser amplitude.

Figure 4D:
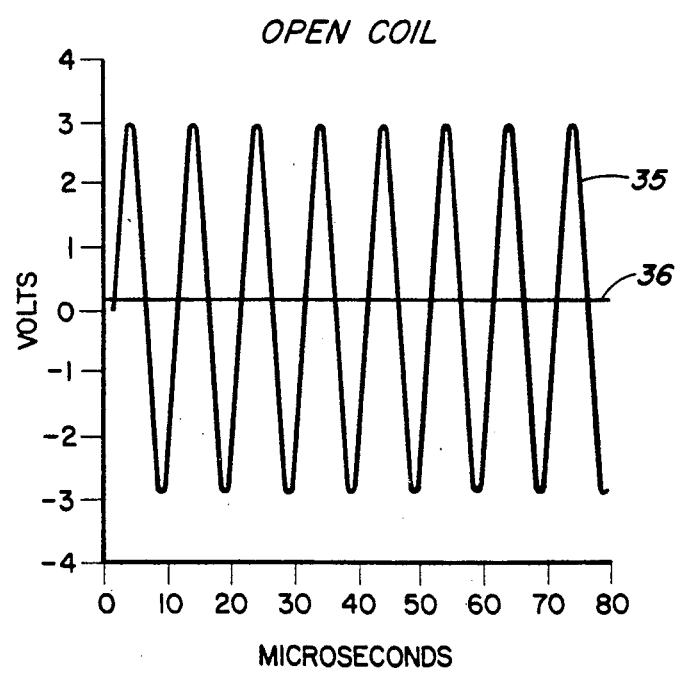

Referring to FIG. 4D, the presentation exhibited by placing resonant probe 23 over an open coil assembly is illustrated. Like the presentation at FIG. 4B, the output of the stripline harness 13 is a near zero volt trace 36 at the origin but the reference trace 35 is only slightly diminished in amplitude.

Referring to FIG. 4E, the effect of placing resonant probe 23 adjacent a inductor 14 which has been wired into the circuit in a reverse condition as illustrated. It will be observed, that the presentation is similar to that in FIG. 4C for a satisfactory inductor, however, the harness trace 36 and the reference trace 35 are 180° out of phase.

Referring to FIG. 5, a calibrator probe, termed an RF coupler, is illustrated. It will be observed, that the calibrator probe construction is similar to that of the resonant probe in that it is encapsulated within a body 41. An inductor 42 and matching resistor 43 are connected in a series circuit with matching resistor 43 connected between the center pin of a coaxial connector 44 and center lead of coil 42. It will be noted that rather than a coaxial cable, coaxial fitting 44 is connected to the electrical components.

The lower surface of the calibrator probe is shown to have a recess 45 which is dimensioned to accept and receive the resonant probe 23 therein.

Referring to FIG. 6, a calibration arrangement is shown. A function generator 46 is connected to the body 41 and to a readout device 47. Resonant probe 23 is fitted on coupler 41 and connected to oscilloscope 47 and to a universal counter 48 by conventional wiring techniques. Function generator 46 is set for the approximate resonant frequency of probe 23, 100 KHz, and a signal is observed on the oscilloscope 47. The frequency of function generator 46 is adjusted to produce a peak voltage and the frequency displayed is observed on a universal counter 48. This indicated frequency will be the resonant frequency of resonant probe 23. It is this frequency which provide the target frequency for the RF signal generator 21 in the testing environment. The output of the function generator is adjusted to provide a datum level output, 2 V P—P in the illustrated arrangement.

Thus it may be seen that the foregoing description taken together with the appended claims constitute a disclosure such as to enable a person skilled in the electronics and instrumentation arts and having the benefit of the teachings contained therein to make and use the invention. Further, the structure herein described meets the objects of the invention, and generally constitute a meritorious advance in the art which would be unobvious to such a skilled worker not having the benefit of these teachings.

What is claimed is:

1. A test set for testing inductor and stripline assemblies comprising:
   a source of radio frequency electrical energy;
   a readout device connected to said source of radio frequency electrical energy and adapted to receive output signals from an assembly of stripline mounted inductors connected thereto;
   a resonant probe configured to cooperate with inductors mounted on said stripline and having a planar wound coil having inner and outer leads mounted therein; and
   a coaxial cable transmission line connecting said resonant probe and said source of radio frequency energy and having a length sufficient to permit said resonant probe to be placed sequentially over said stripline mounted inductors.

2. A test set according to claim 1 wherein said resonant probe further includes a capacitor connected across said planar wound coil so as to be in parallel therewith.

3. A test set according to claim 1 wherein said planar wound coil is supported on an insulator.

4. A test set according to claim 3 in which said planar wound coil is bonded to said insulator by an adhesive layer.

5. A test set according to claim 1 in which said coaxial cable includes:
an inner conductor connected to the center lead of said planar wound coil; and
an outer shield which is connected to the outer lead of said planar wound coil.

6. A test set according to claim 1 wherein said resonant probe is encased in an insulating plastic housing.

7. A test set according to claim 1 in which said read out device is an oscilloscope.

8. A test set according to claim 1 in which said resonant probe includes:

a capacitor electrically connected in parallel with said planar wound coil;
an insulator bonded to said planar wound coil; and
an insulating mass of plastic encapsulating said planar wound coil, said capacitor and said insulator and configured such that a planar face thereof is parallel to said planar wound coil and spaced a predetermined distance therefrom.

9. A test set according to claim 8 in which said coaxial cable includes:
an inner conductor connected to the center lead of said planar wound coil; and
an outer shield which is connected to the outer lead of said planar wound coil.

10. A test set according to claim 9 in which said read-out device is an oscilloscope.

11. A test set according to claim 1 further including a calibration coupler including a series L-R circuit within a housing, said housing having a recess dimensioned to receive said resonant probe for selective calibration.

* * * * *